(12) United States Patent
Ko

(10) Patent No.: US 10,343,544 B2
(45) Date of Patent: Jul. 9, 2019

(54) APPARATUS AND METHOD FOR CONTROLLING CHARGING OF BATTERY FOR HYBRID VEHICLE

(71) Applicant: HYUNDAI MOTOR COMPANY, Seoul (KR)

(72) Inventor: Kyu Beom Ko, Incheon (KR)

(73) Assignee: Hyundai Motor Company, Seoul (KR)

( * ) Notice: Subject to any disclaimer, the term of this patent is extended or adjusted under 35 U.S.C. 154(b) by 232 days.

(21) Appl. No.: 15/377,874

(22) Filed: Dec. 13, 2016

(65) Prior Publication Data
US 2018/0118049 A1   May 3, 2018

(30) Foreign Application Priority Data
Nov. 1, 2016 (KR) .................. 10-2016-0144769

(51) Int. Cl.
| | |
|---|---|
| H02J 7/00 | (2006.01) |
| H02J 7/14 | (2006.01) |
| B60L 11/18 | (2006.01) |
| G01R 31/367 | (2019.01) |
| G01R 31/44 | (2006.01) |
| B60L 53/00 | (2019.01) |
| B60L 58/16 | (2019.01) |
| B60L 58/12 | (2019.01) |

(52) U.S. Cl.
CPC .......... B60L 11/1861 (2013.01); B60L 53/00 (2019.02); B60L 58/12 (2019.02); B60L 58/16 (2019.02); G01R 31/367 (2019.01); G01R 31/44 (2013.01); H02J 7/007 (2013.01); H02J 7/1492 (2013.01)

(58) Field of Classification Search
USPC ....... 320/162, 134, 132, 136, 107, 109, 150, 320/103, 104, 106, 112
See application file for complete search history.

(56) References Cited

U.S. PATENT DOCUMENTS

| | | | | |
|---|---|---|---|---|
| 8,825,417 | B1* | 9/2014 | Krolak | H01M 10/4207 320/134 |
| 8,872,474 | B2* | 10/2014 | Scheucher | B60K 1/04 320/107 |
| 2006/0181245 | A1* | 8/2006 | Mizuno | G01R 31/3624 320/132 |
| 2009/0027056 | A1* | 1/2009 | Huang | B60L 11/1857 324/439 |
| 2012/0242293 | A1* | 9/2012 | Yumura | H02J 3/32 320/134 |

(Continued)

FOREIGN PATENT DOCUMENTS

| | | |
|---|---|---|
| JP | 2011-215125 A | 10/2011 |
| JP | 2012-58028 A | 3/2012 |

(Continued)

*Primary Examiner* — Alexis B Pacheco
(74) *Attorney, Agent, or Firm* — Knobbe, Martens, Olson & Bear LLP

(57) ABSTRACT

A method of controlling charging of a battery connected to a wheel driving motor for a hybrid vehicle is disclosed. The method comprises detecting battery charging information when a battery is charged; learning a state of health (SOH) of the battery by using the battery charging information; calculating a battery charging current by using the learned SOH; and controlling charging of the battery using the battery charging current.

12 Claims, 6 Drawing Sheets

(56) References Cited

U.S. PATENT DOCUMENTS

| | | | | |
|---|---|---|---|---|
| 2012/0256599 | A1* | 10/2012 | Gu | G01R 31/3679 320/149 |
| 2013/0300373 | A1* | 11/2013 | Vivanco-Sarabia | H02J 7/0014 320/134 |
| 2013/0307334 | A1* | 11/2013 | Middleton | G01R 31/3624 307/31 |
| 2014/0009123 | A1* | 1/2014 | Park | G01R 31/361 320/152 |
| 2014/0167657 | A1* | 6/2014 | Nishikawa | H01M 10/441 318/139 |
| 2014/0197776 | A1* | 7/2014 | Schlaupitz | H02J 7/00 320/103 |
| 2015/0293183 | A1* | 10/2015 | Tenmyo | H01M 10/48 324/429 |
| 2015/0357852 | A1* | 12/2015 | Nakao | G01R 31/3624 320/162 |
| 2015/0369874 | A1* | 12/2015 | Park | G01R 31/3651 702/63 |
| 2016/0218525 | A1* | 7/2016 | Takao | H02J 7/0016 |
| 2016/0221465 | A1* | 8/2016 | Kratzer | G01R 31/44 |
| 2016/0301219 | A1* | 10/2016 | Desprez | H01M 10/0525 |
| 2016/0352125 | A1* | 12/2016 | Choi | H02J 7/0063 |
| 2017/0123009 | A1* | 5/2017 | You | G01R 31/3651 |
| 2017/0170667 | A1* | 6/2017 | Chang | H02J 7/02 |
| 2017/0299660 | A1* | 10/2017 | Saint-Marcoux | B60L 11/14 |

FOREIGN PATENT DOCUMENTS

| | | |
|---|---|---|
| JP | 4983818 B2 | 7/2012 |
| JP | 2013-60056 A | 4/2013 |
| JP | 5242997 B2 | 7/2013 |
| JP | 2014-137003 A | 7/2014 |
| JP | 2016-182895 A | 10/2016 |
| KR | 10-2011-0084633 A | 7/2011 |
| KR | 10-2013-0126231 A | 11/2013 |
| KR | 10-1526763 B1 | 6/2015 |

* cited by examiner

APPARATUS AND METHOD FOR CONTROLLING CHARGING OF BATTERY FOR HYBRID VEHICLE

CROSS-REFERENCE TO RELATED APPLICATION

This application claims priority to and the benefit of Korean Patent Application No. 10-2016-0144769 filed in the Korean Intellectual Property Office on Nov. 1, 2016, the entire contents of which are incorporated herein by reference.

BACKGROUND

(a) Field

The present disclosure relates to an apparatus and a method for controlling charging of a battery for a hybrid vehicle or an electric vehicle.

(b) Description of the Related Art

Recently, as problems of earth's environmental pollution become serious day by day, importance of the use of pollution-free energy has increased day by day. Particularly, problems of air pollution in a big city become serious day by day, and exhaust gas of an automobile is one of the main reasons.

In order to solve the problems of the exhaust gas, and improve fuel efficiency, an environmentally-friendly vehicle including a hybrid vehicle and an electric vehicle has been developed and operated.

The hybrid vehicle has power generated by an engine and a (wheel-driving) motor, and is driven by appropriately using power generated by a combustion action of the engine and power generated by a rotation of the motor by using electric energy stored in a battery.

The hybrid vehicle may be operated in a travelling mode, such as an electric vehicle (EV) mode that is a pure electric vehicle mode using only power of the motor, a hybrid electric vehicle (HEV) mode using rotational force of the engine as main power and rotational force of the motor as auxiliary power, and a regenerative braking (RB) mode, which collects braking and inertia energy while the vehicle brakes or travels by inertia through the generation of the motor and charges a battery 60 with the collected energy.

The hybrid vehicle uses mechanical energy of the engine and electric energy of the battery together, uses an optimum operation region of the engine and the motor, and collects energy from the motor when the vehicle brakes, thereby improving fuel efficiency and efficiently using energy.

Further, the hybrid vehicle charges the battery through the starting/generation of the motor in an engine idle state according to a state of charge (SOC) of the battery.

However, when the charging and the discharging of the battery are repeated, a capacity of the battery is decreased. Further, in the battery, the precipitation of ions is increased by the generation of impurities, and deterioration of the battery is increased, so that internal resistance of the battery is increased.

Accordingly, a polarization voltage by the internal resistance existing in the battery is increased, so that there is a problem in that energy actually stored in the battery is decreased.

The disclosure of this section is to provide background of the invention. Applicant notes that this section may contain information available before this application. However, by providing this section, Applicant does not admit that any information contained in this section constitutes prior art.

SUMMARY

The present disclosure has been made in an effort to provide an apparatus and a method for controlling charging of a battery for a hybrid vehicle, which are capable of controlling a charging output of a battery by learning a state of health (SOH) of the battery. An embodiment of the present invention provides a method of controlling charging of a battery for a hybrid vehicle by a battery charging control apparatus for a hybrid vehicle, the method including: detecting battery charging information when a battery is charged; learning a state of health (SOH) of the battery by using the battery charging information; calculating a battery charging output by using the learned SOH; and controlling the battery to be charged by using the battery charging output.

The detecting of the charging information may include: detecting a variation of a state of charge (SOC) before and after the charging when the battery is charged; and measuring a battery charging variation by the charging of the battery.

The learning of the SOH may include: estimating maximum battery energy by using the variation of the SOC and the battery charging variation; and estimating the SOH by the charging of the battery by using the maximum battery energy.

The learning of the SOH may include estimating an SOH whenever the battery is charged, and calculating a final SOH by applying a weighted value to the SOH estimated during the recent charging.

The calculating of the battery charging output may include: calculating a battery charging capacity chargeable in the battery in a current state by multiplying the final SOH and an initial capacity of the battery.

The calculating of the battery charging output may include calculating a charging time by using the initial capacity of the battery and an initial charging output (an initial charging current), and calculating the battery charging output (battery charging current) by dividing the battery charging capacity by the charging time.

The controlling at the battery to be charged may include charging the battery by using a charging current value corresponding to the battery charging output.

Another embodiment of the present invention provides an apparatus for controlling charging of a battery for a hybrid vehicle, the apparatus including: a charging information detecting unit configured to detect battery charging information when a battery is charged; a learning unit configured to learn a state of health (SOH) of the battery by using the battery charging information; and a charging controller configured to calculate a battery charging output by using the learned SOH and control the battery to be charged by using the battery charging output.

The charging information may include a variation of a state of charge (SOC) before and after the charging of the battery, and a battery charging quantity by the charging of the battery.

The learning unit may include an SOH estimating unit configured to estimate an SOH by using the variation of the SOC and the battery charging quantity whenever the battery is charged.

The learning unit may further include a final SOH calculating unit configured to calculate a final SOH by applying a weighted value to the SOH estimated during the recent charging.

The charging controller may include: a charging output calculating unit configured to calculate the battery charging output by using the final SOH; and a charging current calculating unit configured to calculate a charging current value corresponding to the battery charging output.

The charging output calculating unit may calculate a battery charging capacity by multiplying the final SOH and the initial capacity of the battery, calculate a charging time by using the initial capacity of the battery and an initial charging output, and calculate the battery charging output by dividing the battery charging capacity by the charging time.

According to embodiments of the present invention, it is possible to estimate an SOH when a battery is charged, learn an SOH for next charging by applying a weighted value to the recently estimated SOH, draw a battery charging capacity and a battery charging output by using the learned SOH, and control a battery charging current value, thereby minimizing a polarization voltage by internal resistance of the battery, and resulting in providing an environment in which power charged in the battery is maximally increased.

DETAILED DESCRIPTION

Figure 1:
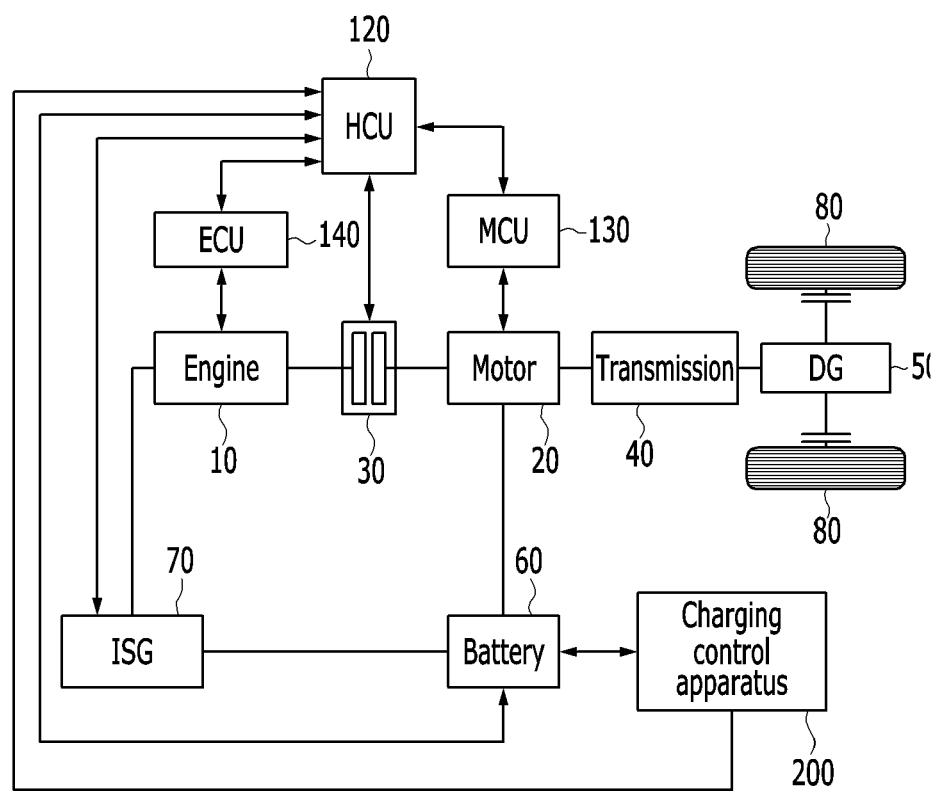
FIG. 1 is a block diagram conceptually illustrating a configuration of a battery charging control system for a hybrid vehicle according to an embodiment of the present invention.

In the following detailed description, embodiments of the present invention have been shown and described, simply by way of illustration. As those skilled in the art would realize, the described embodiments may be modified in various different ways. Accordingly, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising", will be understood to imply the inclusion of stated elements but not the exclusion of any other elements.

Further, terms "~ unit" and "~ module" described in the specification means a unit processing at least one function or operation, and may be implemented by hardware, software, or a combination of hardware and software.

Hereinafter, a battery charging control apparatus and a battery charging control method for a hybrid vehicle according to an embodiment of the present invention will be described in detail with reference to FIGS. 1 to 6.

An aspect of the present invention provides a system or method for charging a battery connected to a motor for wheel driving in a hybrid vehicle or an electric vehicle. A computerized controller installed in a vehicle controls changing conditions including a charging current. In embodiments, the computerized controller causes the battery to be charged using a current (or a power) that is lower than a predetermined initial charge current (or a predetermined initial charge power). In embodiments, the predetermined initial charge current is at least one from a published specification of the battery (or an initial charging output), a minimum constant input current for fully charging the battery within a predetermined charging time and a current for charging a factory specification capacity (or an initial capacity) within a factory specification charging time.

In embodiments, the computerized controller uses SOH of the battery to determine a current for charging the battery. The computerized controller uses SOH to compute a minimum constant current to charge the battery within a predetermined charging time. In embodiments, the predetermined charging time is a factory specification charging time, or a time required to charge the initial capacity of the battery (a published specification capacity) with an initial charging current (a published specification charging current) or an initial charging power (a published specification charging power). In embodiments, in charging the battery, the computerized controller maintains the charging current to the battery greater than the computed minimum current and lower than the predetermined initial charge current such that the battery is fully charged within the predetermined charging time (the factory specification charging time). In embodiments, the computerized controller maintains the computed minimum current for charging the battery to keep the charging current as low as possible while enabling full charge of the battery within the predetermined charging time.

In embodiments, SOH of the battery is indicative of the level of deterioration of the battery compared to a predetermined state of the battery. The predetermined state of the battery can be at least one of a published factory specification of the battery, an expected capacity or output voltage of the battery, an initial capacity or output voltage of the battery. In embodiments, the computerized controller collects information of previous charging processes of the battery including at least one from previous SOH values, changes in charged energy (kWh), and a full charging capacity of the battery.

FIG. 1 is a block diagram conceptually illustrating a configuration of a battery charging control system for a hybrid vehicle according to an embodiment of the present invention.

As illustrated in FIG. 1, a hybrid vehicle, to which the charging control system according to an embodiment of the present invention is applied, includes: an engine 10; a motor 20; an engine clutch 30 interrupting power between the engine 10 and the motor 20; a transmission 40; a differential gear device 50; a battery 60; a starting/generating motor 70 for starting the engine 10 or generating power by an output of the engine 10; wheels 80, a hybrid controller 120 controlling a general operation of the hybrid vehicle; a motor controller 130 controlling an operation of the motor 20; an engine controller 140 controlling an operation of the engine 10; and a battery charging controlling apparatus 200 managing and controlling charging of the battery 60.

Figure 2:
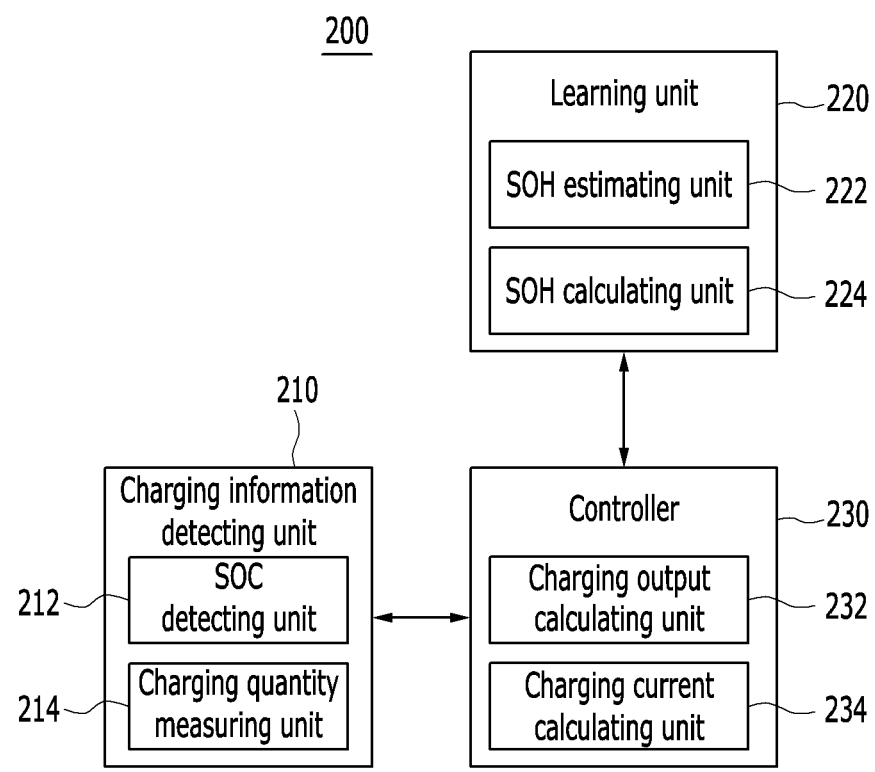
FIG. 2 is a diagram briefly illustrating a structure of a battery charging control apparatus for a hybrid vehicle according to an embodiment of the present invention.

FIG. 2 is a diagram briefly illustrating a structure of a battery charging control apparatus for a hybrid vehicle according to an embodiment of the present invention. In this case, only a schematic configuration of the battery charging control apparatus for the hybrid vehicle required for the description according to an embodiment of the present disclosure is simply illustrated, and the battery charging control apparatus for the hybrid vehicle is not limited to the configuration.

Referring to FIG. 2, the battery charging control apparatus 200 for the hybrid vehicle according to an embodiment of the present invention includes a charging information detecting unit 210, which detects battery charging information when a battery is charged, a learning unit 220, which learns a state of health (SOH) of the battery by using the battery charging information, and a charging controller 230, which calculates a battery charging output by using the learned SOH, and controls the battery to be charged by using the battery charging output.

The charging information detecting unit 210 detects battery charging information whenever the battery of the hybrid vehicle is charged. Here, the battery charging information includes a variation of a state of charge (SOC) before and after the charging of the battery, a battery charging variation by the charging of the battery, and a degradation degree of the battery.

The charging information detecting unit 210 includes an SOC detecting unit 212 and a charging quantity measuring unit 214 according to an embodiment of the present invention.

The SOC detecting unit 212 detects a variation of the SOC before and after the charging whenever the battery is charged. Here, the variation of the SOC includes a value obtained by subtracting a value of the SOC when the charging starts from a value of the SOC when the charging is terminated.

Further, the charging quantity measuring unit 214 measures a battery charging variation by the charging of the battery. The battery charging variation includes a charging energy quantity increased by the charging of the battery.

The learning unit 220 learns an SOH of the battery by using the battery charging information, and updates the learned SOH.

The learning unit 220 includes an SOH estimating unit 222 and an SOH calculating unit 224 according to an embodiment of the present invention.

The SOH estimating unit 222 estimates an SOH by using the variation of the SOC and the battery charging quantity detected whenever the battery is charged.

The SOH estimating unit 222 estimates maximum battery energy by using the variation of the SOC and the battery charging variation, and estimates an SOH by the charging of the battery by using the estimated maximum battery energy. Here, the maximum battery energy includes the energy quantity maximally storable when the charged battery is fully charged.

The SOH calculating unit 224 calculates a final SOH by applying a weighted value to the SOH estimated when the battery is recently charged. The SOH calculating unit 224 calculates the final SOH for next charging by applying the weighted value to a value of the recently updated SOH among the values of the previously updated SOHs.

The charging controller 230 calculates a battery charging output by using the SOH learned in the learning unit 220, and controls the battery to be charged by using a charging current value corresponding to the calculated battery charging output. Herein, the battery charging output includes battery charging power, which is capable of charging a battery for a predetermined time.

The charging controller 230 includes a charging output calculating unit 232 and a charging current calculating unit 234 according to an embodiment of the present invention.

The charging output calculating unit 232 calculates a battery charging output by using the learned SOH. The charging output calculating unit 232 calculates a battery charging capacity in a current state by multiplying the final SOH and a predetermined initial capacity of the battery. Further, the charging output calculating unit 232 calculates a charging time by using the initial capacity of the battery and the predetermined initial charging output of the battery. Then, the charging output calculating unit 232 may calculate the battery charging output by dividing the battery charging capacity by the charging time.

Here, the battery charging capacity includes a maximum energy quantity chargeable in the battery in the current state, and the battery charging output includes an output value applied to the battery per hour for charging the battery.

The charging current calculating unit 234 calculates a charging current value corresponding to the battery charging output.

To this end, the charging controller 230 may be implemented by one or more processors operated by a set program, and the set program is programmed so as to perform each step of a battery charging control method of a hybrid vehicle according to an embodiment of the present invention.

Hereinafter, a battery charging control method of a hybrid vehicle according to an embodiment of the present invention will be described in detail with reference to FIG. 3.

Figure 3:
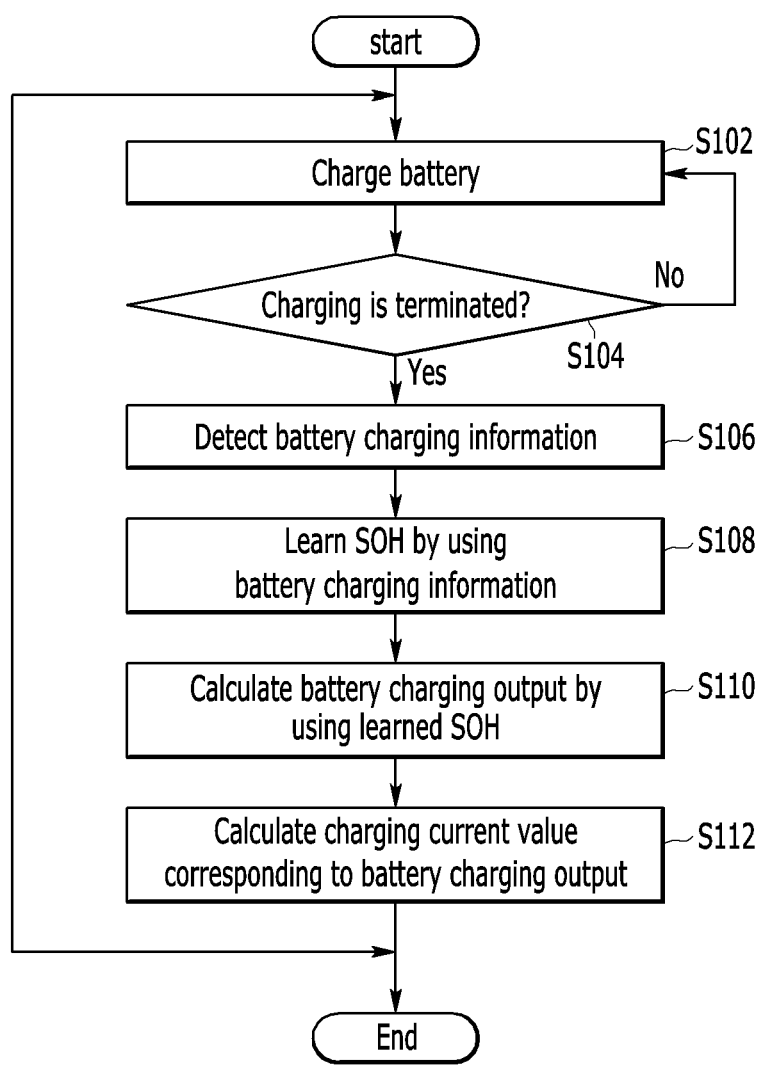
FIG. 3 is a flowchart briefly illustrating a process of controlling charging of a battery for a vehicle according to an embodiment of the present invention.

FIG. 3 is a flowchart briefly illustrating a process of controlling charging of a battery for a vehicle according to an embodiment of the present invention. The flowchart will be described by using the same reference numerals in connection with the configurations of FIGS. 1 and 2.

Referring to FIG. 3, the battery charging control apparatus 200 according to an embodiment of the present invention controls charging of the battery 60 of the hybrid vehicle, and detects battery charging information when the charging of the battery is terminated (S102 to S106). Here, the battery charging information includes a variation of a state of charge (SOC) before and after the charging of the battery, a battery charging variation by the charging of the battery, and a degradation degree of the battery.

Further, the battery charging control apparatus 200 learns an SOH by using the detected battery charging information (S108). The battery charging control apparatus 200 may estimate maximum battery energy by using the variation of the SOC and the battery charging variation detected whenever the battery is charged, and estimate an SOH by using the estimated maximum battery energy whenever the battery is charged.

Further, the battery charging control apparatus 200 may learn a final SOH for N+1$^{th}$ charging after N times charging by applying the SOH estimated during the recent charging.

Table

Table 1 represents battery charging information, maximum battery energy, and an SOH estimation value according to N times charging (in a case where N is 5) according to an embodiment of the present invention.

TABLE 1

| Division | Variation of SOH (%) | Charging variation of battery (kWh) | Maximum battery energy (kWh) | SOH estimation value (%) |
|---|---|---|---|---|
| Nth charging (recent) | 43 | 8.8 | 20.465 | 75.8% |
| N-1$^{th}$ charging | 80.5 | 17 | 21.118 | 78.2% |
| N-2$^{th}$ charging | 33.4 | 6.8 | 20.359 | 75.4% |
| N-3$^{th}$ charging | 24.5 | 4.95 | 20.204 | 74.8% |
| N-4$^{th}$ charging | 52.9 | 11.6 | 21.928 | 81.2% |
| Battery charging output/final SOH | | | 20.681 | 76.6% |

A final SOH for the N+1$^{th}$ charging may be calculated by Equation 1 below.

$$FinalSOH = \frac{(SOH_{N^{th}} \times N + SOH_{N-1^{th}} \times (N-1) + \ldots + SOH_{N-4^{th}} \times (N-4))}{N \times (N+1)/2}$$

For example, the final SOH for the N+1$^{th}$ charging may be calculated as 76.6% by Table 1 and Equation 1.

Further, the battery charging control apparatus 200 calculates a battery charging output by multiplying the learned SOH and an initial capacity of the battery 60 (S110).

In this case, the battery charging control apparatus 200 calculates a battery charging capacity by multiplying the final SOH and the initial capacity of the battery 60. Further, the battery charging control apparatus 200 may calculate a charging time by using the initial capacity of the battery 60 and the initial charging output, and calculate the battery charging output by dividing the battery charging capacity by the charging time.

Here, the battery charging capacity includes a maximum energy quantity chargeable in the battery 60 in the current state, and the battery charging output includes an output value applied to the battery 60 per hour for charging the battery 60.

Further, the battery charging control apparatus 200 calculates a charging current value corresponding to the battery charging output, and controls the battery 60 to be charged by using the calculated charging current value (S112).

That is, when the initial capacity of the battery 60 is 27 kWh, a battery charging capacity to be charged during the N+1$^{th}$ charging of the battery is calculated as 20.681 kWh.

Further, when predetermined initial charging power of the battery 60 is 6.6 kW, the battery charging time is calculated as 4.1 hour by dividing the initial capacity of 27 kWh of the battery 60 by the initial charging output of 6.6 kW.

Accordingly, the battery charging output is calculated as 5.04 kW by dividing the battery charging capacity of 20.681 kWh by 4.1 Hour. Further, the battery charging control apparatus 200 may draw a charging current value corresponding to the battery charging output of 5.04 kW, and control the N+1$^{th}$ charging of the battery by using the drawn charging current value.

Figure 4:
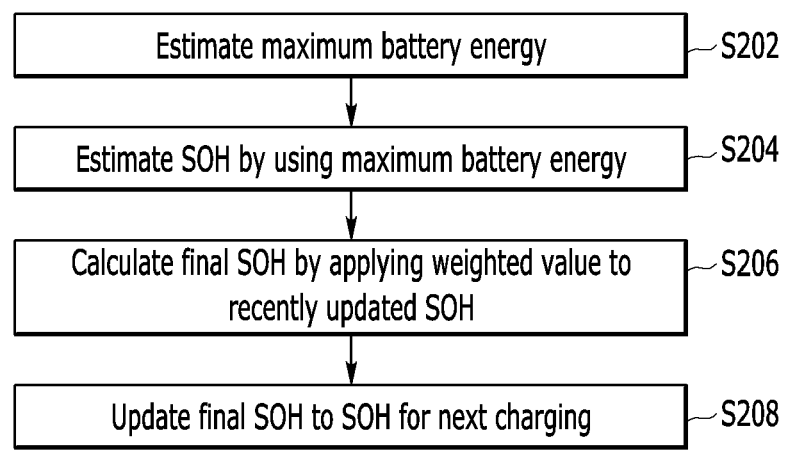
FIG. 4 is a flowchart briefly illustrating a process of learning an SOH of a battery according to an embodiment of the present invention.

FIG. 4 is a flowchart briefly illustrating a process of learning an SOH of a battery according to an embodiment of the present invention. The flowchart will be described by using the same reference numerals in connection with the configurations of FIGS. 1 and 2.

Referring to FIG. 4, when the battery charging control apparatus 200 according to an embodiment of the present invention charges the battery 60 N times, the battery charging control apparatus 200 estimates maximum battery energy chargeable in the battery 60 by using the variation of the SOC and the battery charging variation whenever the battery is charged (S202).

Further, the battery charging control apparatus 200 according to an embodiment of the present invention estimates an SOH by using the maximum battery energy whenever the battery is charged (S204).

Further, the battery charging control apparatus 200 according to an embodiment of the present invention calculates a final SOH after N times charging by applying a weighted value to the recently updated SOH, and the calculated final SOH is updated as an SOH for the N+1$^{th}$ charging (S206 and S208).

Figure 5:
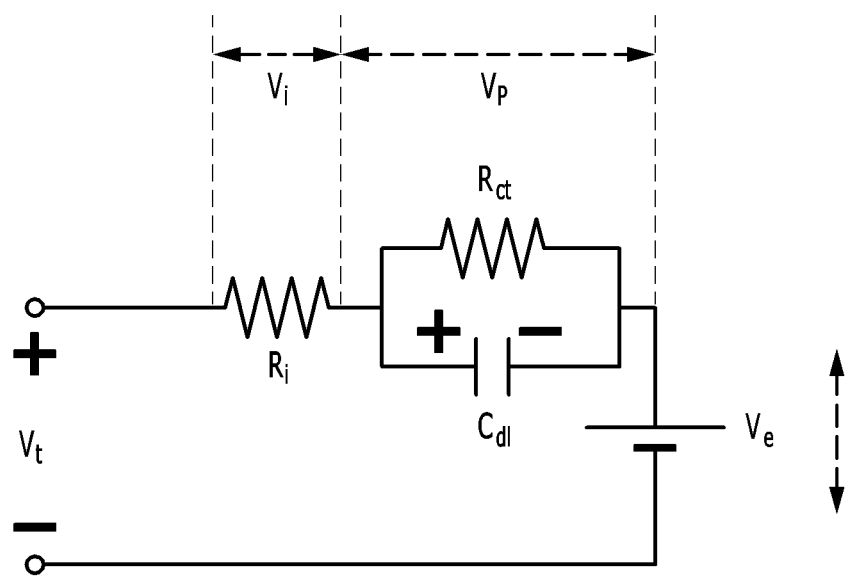
FIG. 5 is an equivalent circuit diagram of a battery according to an embodiment of the present invention.

FIG. 5 is an equivalent circuit diagram of the battery according to an embodiment of the present invention.

Referring to FIG. 5, a battery terminal voltage $V_t$ of a lithium ion battery is the same as a sum of a battery open-circuit voltage $V_e$ (OCV) and a polarization voltage $(V_i+V_e)$ by internal impedance. When a current does not flow in the battery, the battery terminal voltage $V_t$ is the same as the battery open-circuit voltage $V_e$ (OCV), and a voltage measured in a battery terminal represents an actual capacity of the battery.

However, when a current flows in the battery, the polarization voltage $(V_i+V_e)$ by internal impedance is generated. Further, the generated polarization voltage is increased when the current is large and a value of the internal impedance is large.

Figure 6:
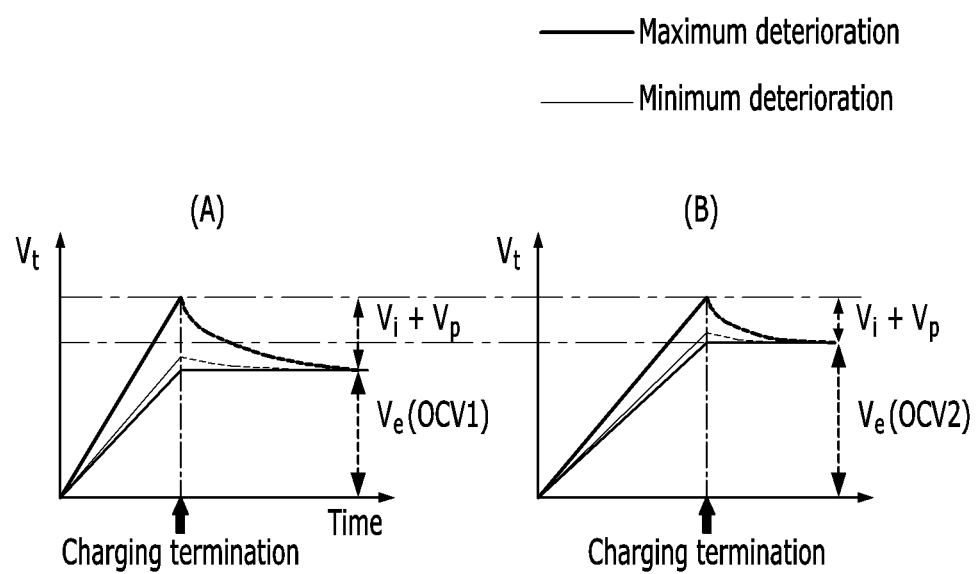
FIG. 6 shows graphs (a) and (b) illustrating a comparison between a terminal voltage of a battery according to an embodiment of the present invention and that of a related art.

FIG. 6 shows graphs (a) and (b) illustrating a comparison between a terminal voltage of a battery according to an embodiment of the present invention and that of a related art.

Referring to (a) of FIG. 6, in the related art, internal resistance of the battery is increased according to an increase in deterioration of the battery, and thus, a polarization voltage $(V_i+V_t)$ is increased during the charging of the battery. Accordingly, a battery terminal voltage $V_t$ becomes a battery open circuit voltage $V_e$ (OCV1), so that a capacity actually charged in the battery is decreased.

However, as illustrated in (b) of FIG. 6, the battery charging method for the hybrid vehicle according to an embodiment of the present invention may minimize a polarization voltage $(V_i+V_t)$ by internal resistance and the like by controlling the battery charging current value, thereby maximally increasing a battery open-circuit voltage $V_e$ (OCV2).

That is, the battery charging method for the hybrid vehicle according to an embodiment of the present invention decreases a charging current for charging the battery within a range, in which a charging time of the battery does not exceed a predetermined time, thereby decreasing a polarization voltage. That is, the polarization voltage disappearing after the termination of the charging is small, so that it is possible to increase actually usable energy according to the battery open-circuit voltage $V_e$ (OCV2) at a charging termination time.

As described above, the battery charging apparatus and the battery charging method for the hybrid vehicle according to embodiments of the present invention estimate an SOH when a battery is charged, learn an SOH for next charging by applying a weighted value to the recently estimated SOH, draw a battery charging capacity and a battery charging output by using the learned SOH, and control a battery charging current value, thereby minimizing a polarization voltage by internal resistance of the battery, and resulting in providing an environment in which power charged in the battery is maximally increased.

Embodiments of the present invention described above are not implemented only by an apparatus and a method, and may be implemented through a program actualizing a function corresponding to the configuration of embodiments of the present invention or a recording medium, in which the program is recorded. The recording medium may be executed in a user terminal, as well as a server.

While this invention has been described in connection with embodiments, it is to be understood that the invention is not limited to the disclosed embodiments, but, on the contrary, is intended to cover various modifications and equivalent arrangements.

What is claimed is:

1. A method of controlling charging of a battery for a hybrid vehicle by a battery charging control apparatus for a hybrid vehicle, the method comprising:
   acquiring battery charging information of a battery;
   subsequently estimating a state of health (SOH) of the battery based on the battery charging information;
   calculating, based on the estimated SOH, battery charging parameters that are to be used for charging the battery; and
   charging the battery by using the battery charging parameters,
   wherein the battery charging parameters comprise a charging current and a charging time, wherein the charging current is smaller than a predetermined initial charging current, wherein the charging time does not exceed a predetermined initial charging time, wherein the predetermined initial charging current and the predetermined initial charging time are calculated based on an initial battery charging power and an initial capacity of the battery.

2. The method of claim 1, wherein the battery charging information comprises a variation of a state of charge (SOC) before and after charging the battery.

3. The method of claim 2, wherein estimating comprises:
   estimating maximum battery energy by using the variation of the SOC; and
   estimating the SOH by the charging of the battery by using the maximum battery energy.

4. The method of claim 1, wherein estimating comprises:
   calculating the SOH for the present charging of the battery by applying a weighted value to the SOH estimated during the recent charging.

5. The method of claim 4, wherein calculating the battery charging parameters comprises:
   calculating a battery charging capacity chargeable in the battery in a current state by multiplying the estimated SOH and the initial capacity of the battery.

6. The method of claim 5, wherein calculating the battery charging parameters comprises:
   calculating the predetermined initial charging time by using the initial capacity of the battery and an initial charging output, and calculating a battery charging output by dividing the battery charging capacity by the predetermined initial charging time.

7. An apparatus for controlling charging of a battery for a hybrid vehicle, the apparatus comprising:
   a charging information acquisition unit configured to acquire battery charging information of a battery;
   a SOH estimation unit configured to estimate a state of health (SOH) of the battery based on the battery charging information; and
   a charging controller configured to calculate battery charging parameters based on the estimated SOH, wherein the charging controller is further configured to control the battery to be charged by using the battery charging parameters,
   wherein the battery charging parameters comprise a charging current and a charging time, wherein the charging current is smaller than a predetermined initial charging current, wherein the charging time does not exceed a predetermined initial charging time, wherein the predetermined initial charging current and the predetermined initial charging time are calculated based on an initial battery charging power and an initial capacity of the battery.

8. The apparatus of claim 7, wherein:
   the battery charging information includes a variation of a state of charge (SOC) before and after the charging of the battery.

9. The apparatus of claim 8, wherein:
   the SOH estimation unit is configured to estimate the SOH by using the variation of the SOC whenever the battery is charged.

10. The apparatus of claim 9, wherein the SOH estimation unit comprises:
    a final SOH calculating unit configured to calculate the SOH for the present charging of the battery by applying a weighted value to the SOH estimated during the recent charging.

11. The apparatus of claim 10, wherein the charging controller includes:
    a charging output calculating unit configured to calculate the battery charging parameters by using the final SOH; and
    a charging current calculating unit configured to calculate the charging current.

12. The apparatus of claim 11, wherein:
    the charging output calculating unit is configured to calculate a battery charging capacity by multiplying the SOH and the initial capacity of the battery, calculate the charging time by using the initial capacity of the battery and an initial charging power, and calculate battery charging power by dividing the battery charging capacity by the charging time.

* * * * *